United States Patent
Ishiwata

[19]

[11] Patent Number: 5,876,843
[45] Date of Patent: Mar. 2, 1999

[54] MAGNETORESISTIVE ELEMENT

[75] Inventor: Nobuyuki Ishiwata, Tokyo, Japan

[73] Assignee: NEC Corporation, Tokyo, Japan

[21] Appl. No.: 798,021

[22] Filed: Feb. 6, 1997

Related U.S. Application Data

[62] Division of Ser. No. 520,739, Aug. 29, 1995, Pat. No. 5,641,557.

[30] Foreign Application Priority Data

Aug. 29, 1994 [JP] Japan .................................. 6-203548

[51] Int. Cl.$^6$ ...................................................... B32B 3/00
[52] U.S. Cl. ........................... 428/209; 360/113; 324/252
[58] Field of Search ................................. 428/209, 210, 428/688, 702; 360/113; 324/252

[56] References Cited

U.S. PATENT DOCUMENTS

| | | |
|---|---|---|
| 4,103,315 | 7/1978 | Hempstead et al. . |
| 4,734,644 | 3/1988 | Imakoshi et al. ........................ 324/252 |
| 5,014,147 | 5/1991 | Parkin et al. ............................ 360/113 |
| 5,018,037 | 5/1991 | Krounbi et al. . |
| 5,402,292 | 3/1995 | Komoda et al. ......................... 360/113 |
| 5,452,163 | 9/1995 | Coffey et al. ............................ 360/113 |
| 5,508,866 | 4/1996 | Gill et al. ................................. 360/113 |
| 5,523,687 | 6/1996 | Mouchot et al. ........................ 324/252 |
| 5,712,565 | 1/1998 | Schultz et al. .......................... 324/252 |

FOREIGN PATENT DOCUMENTS

| | | |
|---|---|---|
| 0 490 608 | 6/1992 | European Pat. Off. . |
| 62-92215 | 4/1987 | Japan . |
| 63-129511 | 6/1988 | Japan . |
| 3-125311 | 5/1991 | Japan . |
| 5-94605 | 4/1993 | Japan . |

OTHER PUBLICATIONS

Robert P. Hunt, "A Magnetoresistive Readout Transducer", *IEEE Transactions on Magnetics*. vol. MAG–7, No. 1, Mar. 1971, pp. 150–154.

*Primary Examiner*—Elizabeth Evans
*Attorney, Agent, or Firm*—Young & Thompson

[57] ABSTRACT

A surface structure of a magnetoresistive film includes a magnetosensitive portion surrounded by a peripheral portion including at least an electrode film and a magnetic film underlying the electrode film for applying a unidirectional magnetic field onto the magnetosensitive portion. Side edges of the magnetoresistive film are covered by the magnetic film to be separated from the electrode film. An insulation film is on at least a peripheral area of a top surface of the magnetoresistive film so that a part of the electrode film extends on the insulating film so that the top surface of the magnetoresistive film is separated by the insulating film from the electrode film so as to keep an effective area of the magnetoresistive film in an actual area thereof.

17 Claims, 3 Drawing Sheets

MAGNETORESISTIVE ELEMENT

This application is a division of application Ser. No. 08/520,739, filed Aug. 29, 1995 now U.S. Pat. No. 5,641,557 issued Jun. 24, 1997.

BACKGROUND OF THE INVENTION

The invention relates to an electromagnetic transducer, and more particularly to a magnetoresistive element utilizing a magnetoresistive effect usable for magnetic recorders.

Even as the size of magnetic recorders has decreased and their capacity has increased, the need for an improved; high density magnetic recording technique has increased. The electromagnetic transducer utilizing the magnetoresistive effect (MR effect) is capable of providing a regenerative power, for which reason development of an improved technique utilizing the magnetoresstive effect is essential and important for improvement of high density magnetic recording.

A magnetoresistive transducer or a MR head is disclosed in IEEE Transactions on Magnetics, Vol. MAG-7, No. 1, March 1971 "A Magnetoresistive Readout Transducer". The MR head requires an application of a unidirectional magnetic field onto a magnetoresistive film (Ni—Fe film) for controlling magnetic domains of the film wherein the magnetoresistive film has a magnetic sensitivity to an external magnetic field.

In order to reduce Barkhausen noise, the Ni—Fe magnetoresistive film has a magnetosensensitive film whose opposite ends are laminated thereon with antiferromagnetic films such as Fe—Mn films so that a unidirectional magnetic field is generated due to a switched connection at an interface between the Ni—Fe film and the antiferromagnetic film thereby resulting in the unidirectional magnetic field being applied to the magnetic sensitive portion. This technique is disclosed in the U.S. Pat. No. 4,103,315 issued to Hempstead et al.

According to the technique disclosed in the above U.S. patent, the Ni—Fe magnetoresistive film having the magnetic sensitivity is formed contiguously to the antiferromagnetic film for generating a unidirectional magnetic field for control of the magnetic domains. For that reason, when the antiferrormagnetic film is formed to apply the unidirectional magnetic field to the magnetic sensitive portion of the Ni—Fe film, then the contiguous formation of the Fe—Mn antiferromagnetic film to the Ni—Fe magnetoresistive film results in a magnetization at opposite ends of the magnetic sensitive portion being fixed due to the switched connection between the Fe—Mn antiferromagnetic film to the Ni—Fe magnetoresistive film. The fixed magnetization may degrade sensitivity to the external magnetic field. An outside portion of the Ni—Fe magnetoresistive film positioned outside the magnetic sensitive portion and a soft magnetic film for bias are influenced by a magnetic flux from a track other than the readout track thereby resulting in generation of undesirable noises.

To settle the above problems, the Ni—Fe film is formed only on the magnetic sensitive portion and hard magnetic films are formed at opposite ends of the Ni—Fe film for magnetization thereof to generate the unidirectional magnetic field to thereby apply the magnetic field onto the magnetic sensitive portion. This technique is disclosed in the Japanese laid-open patent application No. 3-125311.

According to the technique disclosed in the Japanese laid-open patent application No. 3-125311, the magnetoresistive film or the bias soft magnetic film resides only on the magnetic resistive portion thereby the device is free from the problem of influences from the magnetic flux from the track other than the readout track. This technique, however, provides the following problem. Due to an actual limitation of an accuracy in alignment in the process for forming a magnetic head or the MR head, electrode films provided at opposite ends of the magnetoresistive film tend to superimpose the opposite end portions thereof so that the actual width of the track is narrower than the predetermined width thereof, resulting in a reduction of the output power.

Under the above circumstances, it has been required to develop a novel magnetoresistive element free from the above problems.

SUMMARY OF THE INVENTION

Accordingly, it is an object of the present invention to provide a novel magnetoresistive element free from the above problems.

It is a further object of the present invention to provide a novel magnetoresistive element with a high output independent from a variation in a width of a track.

It is a furthermore object of the present invention to provide a novel magnetoresistive element for allowing variation in width of the track.

The above and other objects, features and advantages of the present invention will be apparent from the following descriptions.

The present invention provides a novel surface structure of a magnetoresistive film, which includes in a magnetosensitive portion surrounded by a peripheral portion including at least an electrode film and a magnetic film underlying the electrode film for applying a unidirectional magnetic field onto the magnetosensitive portion. Edges of the magnetoresistive film are covered by the magnetic film to be separated from the electrode film. An insulation film is provided on at least a peripheral area of a top surface of the magnetoresistive film so that a part of the electrode film extends on the insulating film thereby the top surface of the magnetoresistive film is separated by the insulating film from the electrode film so as to keep an effective area of the magnetoresistive film in an actual area thereof.

The present invention also provides a magnetoresistive element comprising a substrate, a magnetosensitive portion selectively formed on a predetermined area of the substrate and having a trapezoidal cross sectional shape and sloped side walls, and a peripheral portion provided on the substrate except on the predetermined area to surround the magnetosensitive portion.

The magnetosensitive portion comprises a soft magnetic film selectively formed on the predetermined area of the substrate, a magnetic separation film formed on the soft magnetic film, a magnetoresistive film formed on the magnetic separation film, and an insulation film formed on the magnetoresistive film. The peripheral portion comprises a magnetic layer formed on the substrate except on the predetermined area and extending on the sloped side walls of the magnetosensitive portion, and an electrode layer formed by sputtering on the magnetic layer and a portion of the electrode layer extending on a peripheral portion of a top surface of the insulation film.

The top surface of the magnetoresistive film is separated by the insulating film from the electrode layer so as to keep an effective area of the magnetoresistive film in an actual area thereof.

BRIEF DESCRIPTIONS OF THE DRAWINGS

Preferred embodiments of the present invention will be described in detail with reference to the accompanying drawings.

DESCRIPTION OF THE INVENTION

Figure 1A:
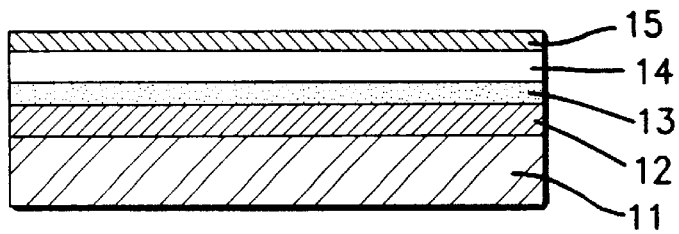
FIGS. 1A to 1E are fragmentary cross sectional elevation views illustrative of sequential processes of a method for fabricating a novel magnetoresistive element in a first embodiment according to the present invention.

A first embodiment according to the present invention will be described with reference to FIGS. 1A to 1E. A structure of the magnetoresistive element in the first embodiment according to the present invention will be described with reference to FIG. 1E.

A magnetoresistive element is formed on a substrate 11 which may be made of ceramic. Laminated multi-layers having a trapezoidal shape are selectively formed on a predetermined area of the substrate 11. The laminated multi-layers comprise a soft magnetic film 12 formed on a top surface of the substrate 11, a magnetic separation film 13 formed on a top surface of the soft magnetic film 12, a magnetoresistive film 14 formed on a top surface of the magnetic separation film 13, and an insulating film 15 formed on a top surface of the magnetoresistive film 14. The soft magnetic film may comprise a film made of Co—Zr—Mo amorphous having a thickness of 35 nanometers. The magnetic separation film 13 may comprise a film made of Ta having a thickness of 20 nanometers. The magnetoresistive film 14 may comprise a film of Ni—Fe having a thickness of 20 nanometers. The insulating film 15 may comprise a film made of an insulator having a large resistivity, for example, AlOx having a thickness of 10 nanometers. It is preferable that the above multi-layers are laminated to form sloped side walls.

At opposite sides of the above laminated multi-layers, hard magnetic films 17 and electrode films 18 are provided. The hard magnetic film 17 may comprise a Co—Cr—Pt film having a thickness of 40 nanometers. The hard magnetic film 17 is provided on the top surface of the substrate 11 except on the predetermined area on which the above multi-layers are formed. In the vicinity of the above multi-layers, the hard magnetic film 17 is so formed so to cover at least an entire surface of the sloped side walls of the above laminated multi-layers. The electrode films 18 may comprise a tungsten film having a thickness of 100 nanometers. The electrode films 18 are formed on a top surface of the hard magnetic film 17 and inner portions of the electrode films extend over peripheral side edges of the top surface of the insulating film 15, wherein the side walls of the soft magnetic film 12, the magnetic separation film 13 and the magnetoresistive film 14 are separated by the hard magnetic film 17 from the electrode films 18. The combination of the electrode films 18 with the hard magnetic film 17 is provided to apply a unidirectional magnetic field onto the magnetoresistive film 14.

The above laminated multi-layers including the magnetoresistive film 14 corresponds to a magnetic resistive portion and the combination of the electrode film 18 with the hard magnetic film 17 corresponds to the section for applying the unidirectional magnetic field. An entire top surface of the magnetoresistive film 14 is completely covered by the insulating film 15 so that even though parts of the electrode films 18 extend over the magnetic sensitive portion or the magnetoresistive film 14, the magnetoresistive film is surely separated by the insulating film 15 from the electrode films 18. For that reason, the entire part of the magnetoresistive film 14 may possess a magnetic sensitivity and thus is available to be a magnetic sensitive portion so that an area on which tracks are provided may be kept constant independent of a degree of the superimposition of the electrode films 18 over the magnetoresitive film 14. The provision of the insulating film 15 to cover the entire top surface of the magnetoresistive film 14 may render the magnetoresistive element free from the problem in a certain reduction of an effective area of the magnetoresistive film 14, namely a reduction in the width of the tracks provided on the magnetoresistive film 14.

The above novel magnetoresistive element may be fabricated as follows. With reference to FIG. 1A, on the top surface of the substrate 11 made of a ceramic material, there is formed the soft magnetic film 12 comprising the Co—Zr—Mo amorphous film having the thickness of 35 nanometers. The magnetic separation film 13 comprising the Ta film having a thickness of 20 nanometers is formed on the top surface of the soft magnetic film 12. The magnetoresistive film 14 comprising the Ni—Fe film having a thickness of 20 nanometers is formed on the top surface of the magnetic separation film 13. The insulating film 15 made of AlOx having a large resistivity is formed on the top surface of the magnetoresistive film 14.

Figure 1B:
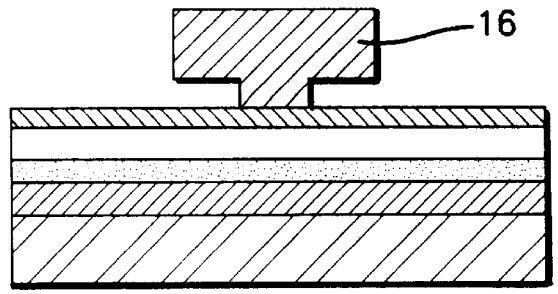

With reference to FIG. 1B, a T-shaped photoresist mask 16 16 is provided on a top surface of the insulating film 15.

Figure 1C:
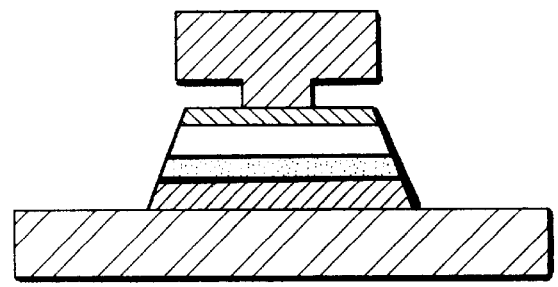

With reference to FIG. 1C, the multi-layers laminations are subjected to a milling process by an ion-milling method using the T-shaped photoresist mask 16, resulting in a selective removal of the multi-layers laminations outside the T-shaped photoresist mask 16 to leave the multi-layers laminations just under the T-shaped photoresist mask 16. In the ion-milling process, it is preferable that the ion-beam is injected at an oblique direction slightly off from the vertical direction to thereby form the trapezoidal cross sectional shape of the remaining portion of the multi-layers laminations. As a result, the remaining multi-layers laminations have sloped side walls.

Figure 1D:
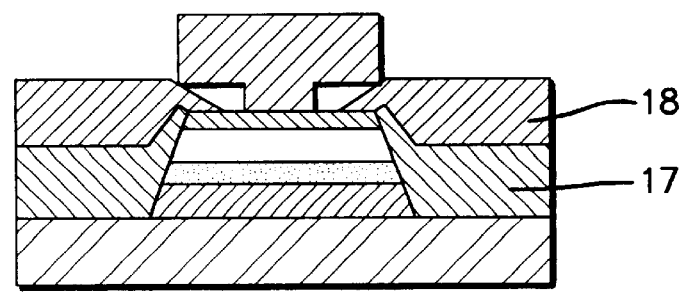

With reference to FIG. 1D, by a sputtering method using the T-shaped photoresist mask 16, the hard magnetic film 17 comprising the Co—Cr—Pt film having a thickness of 40 nanometers is deposited on the substrate 11 as well as on the sloped side walls of the remaining multi-layers laminations. Subsequently, by the sputtering method using the T-shaped photoresist mask 16, the electrode film 18 made of tungsten W is deposited on the hard magnetic film 17 and further a part of the electrode films 18 superimposes a peripheral edge portion of the top surface of the insulating film 15 thereby the magnetoresistive film 14 underlying the insulating film 15 is still kept separated completely from the electrode film 18. In the actual sputtering process, it is unavoidable that tungsten tends to show a diffraction to thereby come into a region under an umbrella of the T-shaped photoresist mask.

Figure 1E:
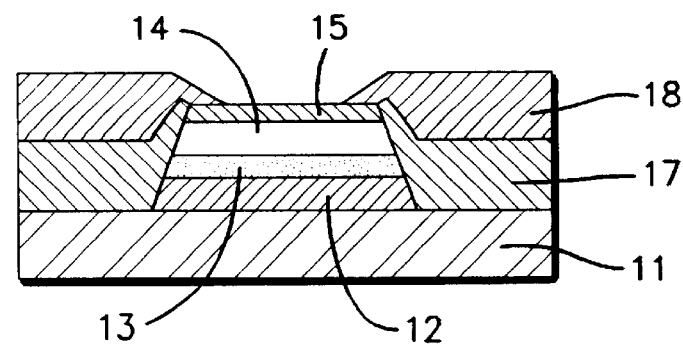

With reference to FIG. 1E, the T-shaped photoresist mask 16 is removed to thereby complete the fabrication process for the magnetoresistive element as described above.

Figure 2:
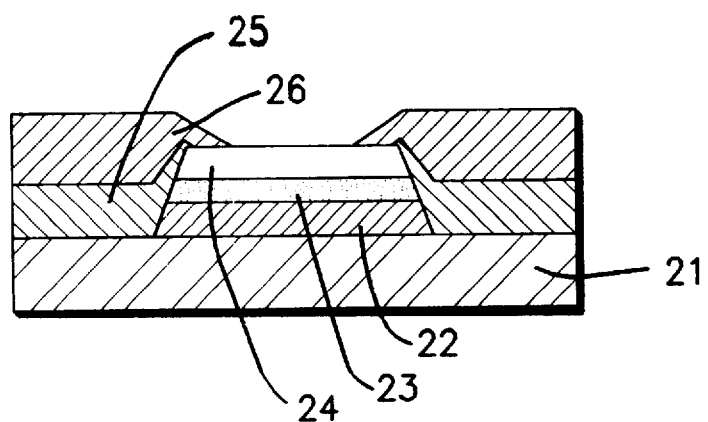
FIG. 2 is a fragmentary cross sectional elevation view illustrative of a novel magnetoresistive element in a comparative example according to the present invention.

In order to evaluate excellent properties of the above novel magnetoresistive element by comparing to the conventional magnetoresistive element, as a comparative example, the typical conventional magnetoresistive element was fabricated. The structure of the conventional magnetoresistive element is illustrated in FIG. 2. A structural difference of the novel magnetoresistive element in the first embodiment according to the present invention from the conventional magnetoresistive element illustrated in FIG. 2 is in the provision of the insulating film which completely covers the top surface of the magnetoresistive film. Namely, the novel magnetoresistive element has the insulating film 15 which covers the magnetoresistive film 14 to separate the magnetoresistive film from the electrode film 18. By contrast, the conventional magnetoresistive element has no insulating film thereby a part of the electrode film 26 superimposes a peripheral edge portion of the top surface of the magnetoresistive film 24.

The conventional magnetoresistive element is formed on a substrate 21 which may be made of ceramic. Laminated multi-layers having a trapezoidal shape are selectively formed on a predetermined area of the substrate 21. The laminated multi-layers comprise a soft magnetic film 22 formed on a top surface of the substrate 21, a magnetic separation film 23 formed on a top surface of the soft magnetic film 22, and a magnetoresistive film 24 formed on a top surface of the magnetic separation film 13. The soft magnetic film may comprise a film made of Co—Zr—Mo amorphous having a thickness of 35 nanometers. The magnetic separation film 23 may comprise a film made of Ta having a thickness of 20 nanometers. The magnetoresistive film 24 may comprise a film of Ni—Fe having a thickness of 20 nanometers. The above multi-layers are laminated to form sloped side walls.

At opposite sides of the above laminated multi-layers, hard magnetic films 25 and electrode films 18 are provided. The hard magnetic film 25 may comprise a Co—Cr—Pt film having a thickness of 40 nanometers. The hard magnetic film 25 is provided on the top surface of the substrate 21 except on the predetermined area on which the above multi-layers are formed. In the vicinity of the above multi-layers, the hard magnetic film 25 is so formed so to cover at least an entire surface of the sloped side walls of the above laminated multi-layers. The electrode films 26 may comprise a tungsten film having a thickness of 100 nanometers. The electrode films 26 are formed on a top surface of the hard magnetic film 17 and inner portions of the electrode films 26 extend over peripheral side edges of the top surface of the magnetoresistive film 24, wherein the side walls of the soft magnetic film 22, the magnetic separation film 23 and the magnetoresistive film 24 are separated by the hard magnetic film 25 from the electrode films 26. However, the peripheral side edge of the top surface of the magnetoresistive film 24 is in contact directly with the inner part of the electrode films 26 thereby the peripheral portion of the magnetoresistive film 24 is unavailable to sense the magnetic field, resulting in a certain reduction of the effective area of the magnetoresistive film 24, a part of which is in contact with the electrode film 26.

Figure 3:
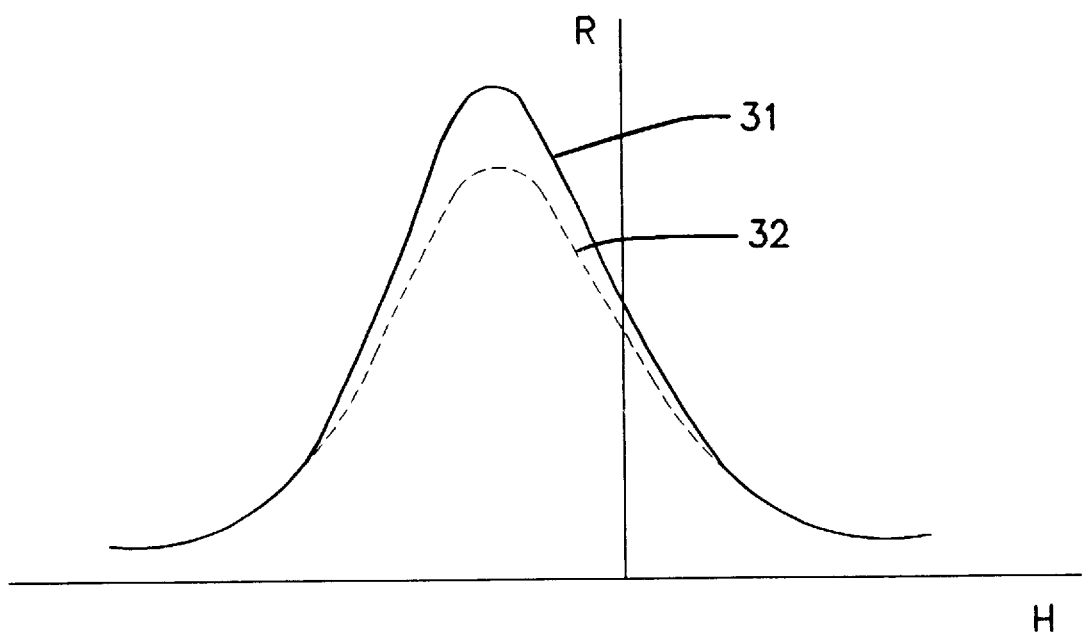
FIG. 3 is a diagram illustrative of resistances of novel and conventional magnetoresistive elements versus an externally applied magnetic field.

FIG. 3 is a diagram illustrative of profiles of resistances of the novel and conventional magnetoresistive elements of FIGS. 1E and 2 respectively versus the intensity of the external magnetic field applied to the magnetoresistive film. The real line 31 represents a profile of the resistance of the novel magnetoresistive element of FIG. 1E and the broken line 32 represents a profile of the resistance of the conventional magnetoresistive element of FIG. 2. From FIG. 3, it would be appreciated that a magnitude in variation of the resistance of the novel magnetoresistive element is larger than that of the conventional magnetoresistive element.

Such a difference in the magnitude of the variation of the resistance between the novel and conventional magnetoresistive elements is due to a difference in the effective area between the magnetoresstive film between the novel and conventional magnetoresistive elements. A large effective area of the magnetoresistive film provides a large variation of the resistance and a small effective area of the magnetoresistive film provides a small variation of the resistance.

According to the present invention, the provision of the insulating film which separate the magnetoresistive film from the electrode film ensures that the entire part of the magnetoresistive film is available to serve as a magnetoressitive portion and the magnetoresistive element is free from any reduction of the effective area from the actual area of the magnetoresistive film and thereby free from any reduction of the variation of the resistance by variation of the magnetic field externally applied to the magnetoresistive film. This may secure the predetermined width of the tracks provided on the magnetoresistive film.

The following modifications of the first embodiment according to the present invention are permitted. The soft magnetic film 12 may comprise an amorphous film including Co as a main component in place of Co—Zr—Mo. Alternatively, the soft magnetic film may comprises a Ni—Fe—M film where M includes at least one selected from the group consisting of Rh, Pd, Nb, Zr, Ta, Hf, Al, Pt, Au, Cr, Mo, W and Si. The magnetic separation film 13 may comprise, in place of Ta, Ti, Zr, W and Nb and a binary, ternary and quaternary compounds as any combinations thereof. The magnetoresistive film 14 may comprise, in place of Ni—Fe, a Ni—Fe—Co film. The insulating film 15 may comprise, in place of AlOx, any other oxide films such as TaOx. The hard magnetic film 17 may comprise, in place of the Co—Cr—Pt film, a Co—Cr film, a Co—Cr—Ta film or a Co—Cr—Pt—Ta film. The electrode film 18 may comprise, in place of tungsten, Ta, Au or Cu.

A second embodiment according to the present invention will be described with reference to FIGS. 4A to 4E. A structure of the magnetoresistive element in the second embodiment according to the present invention will be described with reference to FIG. 4E.

A magnetoresistive element is formed on a substrate 41 which may be made of ceramic. Laminated multi-layers having a trapezoidal shape are selectively formed on a predetermined area of the substrate 41. The laminated multi-layers comprise a soft magnetic film 42 formed on a top surface of the substrate 41, a magnetic separation film 43 formed on a top surface of the soft magnetic film 42, a magnetoresistive film 44 formed on a top surface of the magnetic separation film 43, and an insulating film 45 formed on a top surface of the magnetoresistive film 44. The soft magnetic film may comprise a film made of Co—Zr—Mo amorphous having a thickness of 35 nanometers. The magnetic separation film 43 may comprise a film made of Ta having a thickness of 20 nanometers. The magnetoresistive film 44 may comprise a film of Ni—Fe having a thickness of 20 nanometers. The insulating film 45 may comprise a film made of an insulator having a large resistivity, for example, TaOx having a thickness of 5 nanometers. It is preferable that the above multi-layers are laminated to form sloped side walls.

At opposite sides of the above laminated multi-layers, soft magnetic films 47, antiferromagnetic films 48 and electrode films 49 are provided in turn. The soft magnetic film 47 may comprise a Ni—Fe film having a thickness of 40 nanometers. The soft magnetic film 47 is provided on the top surface of the substrate 41 except on the predetermined area on which the above multi-layers are formed. In the vicinity of the above multi-layers, the soft magnetic film 47 is so formed so to cover at least an entire surface of the sloped side walls of the above laminated multi-layers. The antiferromagnetic film 48 may comprise a Fe—Mn film having a thickness of 15 nanometers. The electrode films 49 may comprise a Ta film having a thickness of 100 nanometers. The electrode films 49 are formed on a top surface of the antiferromagnetic film 47 and inner portions of the electrode films extend over peripheral side edges of the top surface of the insulating film 45, wherein the side walls of the soft magnetic film 42, the magnetic separation film 43 and the magnetoresistive film 44 are separated by the soft magnetic film 47 from the electrode films 49. The combination of the electrode films 49, the antiferromagnetic film 48 and the soft magnetic film 47 is provided to apply a unidirectional magnetic field onto the magnetoresistive film 44.

The above laminated multi-layers including the magnetoresistive film 44 corresponds to a magnetic resistive portion and the combination of the electrode film 49, the antiferrormagnetic film 48 and the soft magnetic film 47 corresponds to the section for applying the unidirectional magnetic field. An entire top surface of the magnetoresistive film 44 is completely covered by the insulating film 45 so that even though parts of the electrode films 49 extend over the magnetic sensitive portion or the magnetoresistive film 44, the magnetoresistive film is surely separated by the insulating film 45 from the electrode films 49. For that reason, the entire part of the magnetoresistive film 44 may possess a magnetic sensitivity and thus is available to be a magnetic sensitive portion so that an area on which tracks are provided may be kept constant independent of a degree of the superimposition of the electrode films 49 over the magnetoresitive film 44. The provision of the insulating film 45 to cover the entire top surface of the magnetoresistive film 44 may render the magnetoresistive element free from the problem in a certain reduction of an effective area of the magnetoresistive film 44, namely a reduction in the width of the tracks provided on the magnetoresistive film 44.

Figure 4A:
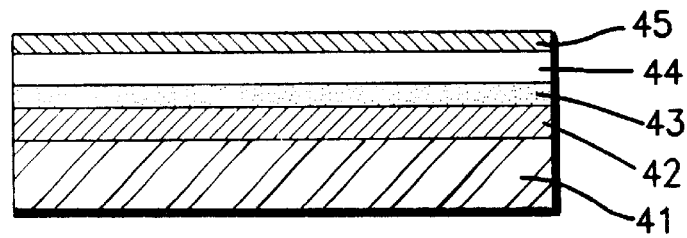
FIGS. 4A to 4E are fragmentary cross sectional elevation views illustrative of sequential processes involved in a method for fabricating a novel magnetoresistive element in a second embodiment according to the present invention.

The above novel magnetoresistive element may be fabricated as follows. With reference to FIG. 4A, on the top surface of the substrate 41 made of a ceramic material, there is formed the soft magnetic film 42 comprising the Co—Zr—Mo amorphous film having the thickness of 35 nanometers. The magnetic separation film 43 comprising the Ta film having a thickness of 20 nanometers is formed on the top surface of the soft magnetic film 42. The magnetoresistive film 44 comprising the Ni—Fe film having a thickness of 20 nanometers is formed on the top surface of the magnetic separation film 43. The insulating film 45 made of TaOx having a large resistivity is formed on the top surface of the magnetoresistive film 44.

Figure 4B:
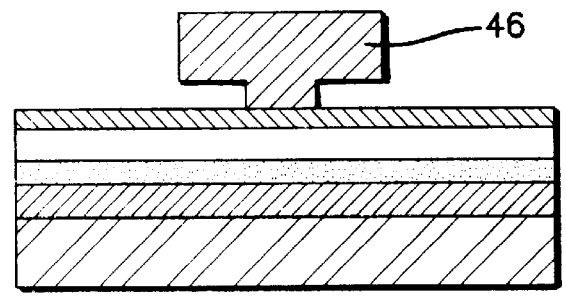

With reference to FIG. 4B, a T-shaped photoresist mask 46 46 is provided on a top surface of the insulating film 45.

Figure 4C:
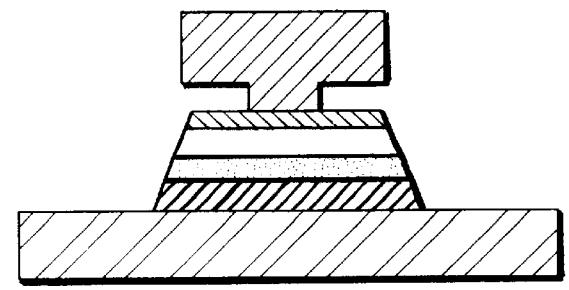

With reference to FIG. 4C, the multi-layers laminations are subjected to a milling process by an ion-milling method using the T-shaped photoresist mask 46, resulting in a selective removal of the multi-layers laminations outside the T-shaped photoresist mask 46 to leave the multi-layers laminations just under the T-shaped photoresist mask 46. In the ion-milling process, it is preferable that the ion-beam is injected at an oblique direction slightly off from the vertical direction to thereby form the trapezoidal cross sectional shape of the remaining portion of the multi-layers laminations. As a result, the remaining multi-layers laminations have sloped side walls.

Figure 4D:
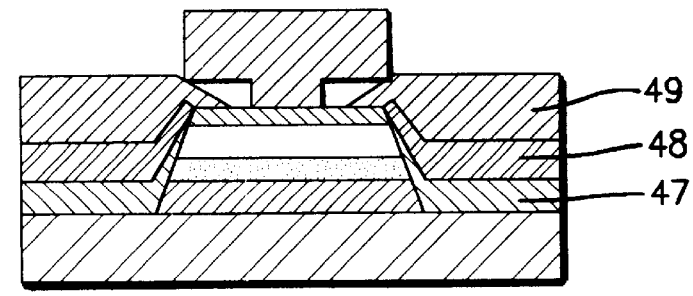

With reference to FIG. 4D, by a sputtering method using the T-shaped photoresist mask 46, the soft magnetic film 47 comprising the Ni—Fe film having a thickness of 40 nanometers is deposited on the substrate 41 as well as on the sloped side walls of the remaining multi-layers laminations. Subsequently, by the sputtering method using the T-shaped photoresist mask 46, the antiferromagnetic film 48 made of Fe—Mn and the electrode film 49 made of Ta are in turn deposited on the soft magnetic film 47 and further a part of the electrode films 49 superimposes a peripheral edge portion of the top surface of the insulating film 45 thereby the magnetoresistive film 44 underlying the insulating film 45 is still kept separated completely from the electrode film 49. In the actual sputtering process, it is unavoidable that tungsten tends to show a diffraction to thereby come into a region under an umbrella of the T-shaped photoresist mask.

Figure 4E:
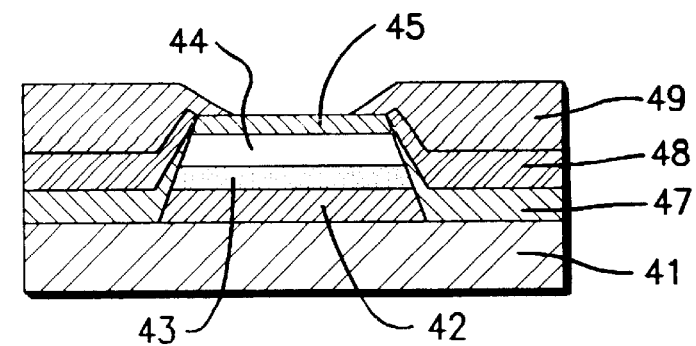

With reference to FIG. 4E, the T-shaped photoresist mask 46 is removed to thereby complete the fabrication process for the magnetoresistive element as described above.

There was confirmed the fact that a magnitude in variation of the resistance of the novel magnetoresistive element is larger than that of the conventional magnetoresistive element. Such a difference in the magnitude of the variation of the resistance between the novel and conventional magnetoresistive elements is due to a difference in the effective area between the magnetoresstive film between the novel and conventional magnetoresistive elements. A large effective area of the magnetoresistive film provides a large variation of the resistance and a small effective area of the magnetoresistive film provides a small variation of the resistance.

According to the present invention, the provision of the insulating film which separate the magnetoresistive film from the electrode film ensures that the entire part of the magnetoresistive film is available to serve as a magnetoressitive portion and the magnetoresistive element is free from any reduction of the effective area from the actual area of the magnetoresistive film and thereby free from any reduction of the variation of the resistance by variation of the magnetic field externally applied to the magnetoresistive film. This may secure the predetermined width of the tracks provided on the magnetoresistive film.

The following modifications of the second embodiment according to the present invention are permitted. The soft magnetic film 42 may comprise an amorphous film including Co as a main component in place of Co—Zr—Mo. Alternatively, the soft magnetic film may comprises a Ni—Fe—M film where M includes at least one selected from the group consisting of Rh, Pd, Nb, Zr, Ta, Hf, Al, Pt, Au, Cr, Mo, W and Si. The magnetic separation film 43 may comprise, in place of Ta, Ti, Zr, W and Nb and a binary, ternary and quaternary compounds as any combinations thereof. The magnetoresistive film 44 may comprise, in place of Ni—Fe, a Ni—Fe—Co film. The insulating film 45 may comprise, in place of TaOx, any other oxide films such as AlOx. The soft magnetic film 47 may comprise, in place of the Ni—Fe film, a Co—Cr film, a Co—Cr—Ta film or a Co—Cr—Pt—Ta film. The antiferromagnetic film may comprise, in place of Fe—Mn, Ni—Mn, Ni—O, Co—O or Tb—Fe. The electrode film 49 may comprise W, Au or Cu in place of Ta.

Whereas modifications of the present invention will be apparent to a person having ordinary skill in the art, to which the invention pertains, it is to be understood that embodiments as shown and described by way of illustrations are by no means intended to be considered in a limiting sense.

Accordingly, it is to be intended to cover by claims any modifications of the present invention which fall within the spirit and scope of the present invention.

What is claimed is:

1. A magnetoresistive element comprising:

a substrate;

a magnetosensitive portion selectively formed on a predetermined area of said substrate, said magnetosensitive portion having a trapezoidal cross sectional shape and sloped side walls, and said magnetosensitive portion comprising:

a soft magnetic film selectively formed on said predetermined area of said substrate;

a magnetic separation film formed on said soft magnetic film;

a magnetoresistive film formed on said magnetic separation film; and an insulation film formed on said magnetoresistive film;

a peripheral portion provided on said substrate except on said predetermined area to surround said magnetosensitive portion, said peripheral portion comprising:

a magnetic layer formed on said substrate except on said predetermined area and extending on said sloped side walls of said magnetosensitive portion; and an electrode layer formed by sputtering on said magnetic layer and a portion of said electrode layer extending on a peripheral portion of a top surface of said insulation film; whereby said top surface of said magnetoresistive film is separated by said insulating film from said electrode layer so as to keep an effective area of said magnetoresistive film in an actual area thereof.

2. The structure as claimed in claim 1, wherein said insulation film comprises an oxide film.

3. The structure as claimed in claim 2, wherein said oxide film is made of AlOx.

4. The structure as claimed in claim 2, wherein said oxide film is made of TaOx.

5. The structure as claimed in claim 1, wherein said electrode layer is made of a material selected from the group consisting of W, Ta, Au and Cu.

6. The structure as claimed in claim 1, wherein said magnetoresistive film is made of a material selected from the group consisting of Ni—Fe and Ni—Fe—Co.

7. The structure as claimed in claim 1, wherein said magnetic layer comprises a hard magnetic layer made of a material selected from the group consisting of Co—Cr—Pt, Co—Cr, Co—Cr—Ta and Co—Cr—Pt—Ta.

8. The structure as claimed in claim 1, wherein said magnetic layer comprises a soft magnetic layer made of Ni—Fe and an antiferromagnetic film sandwiched between said electrode layer and said soft magnetic layer, said antiferromagnetic layer being made of a material selected from the group consisting of Fe—Mn, Ni—Mn, Ni—O, Co—O and Tb—Fe.

9. The structure as claimed in claim 1, wherein said soft magnetic film comprises an amorphous film including Co as a main component.

10. The structure as claimed in claim 1, wherein said soft magnetic film is made of Co—Zr—Mo.

11. The structure as claimed in claim 1, wherein said soft magnetic film is made of Ni—Fe—M where M is a material including at least one selected from the group consisting of Rh, Pd, Nb, Zr, Ta, Hf, Al, Pt, Au, Cr, Mo, W and Si.

12. The structure as claimed in claim 1, wherein said magnetic separation film is made of a metal or an alloy selected from the group consisting of Ta, Ti, Zr, W and Nb.

13. A magnetoresistive element comprising:

a substrate;

a magnetosensitive portion on said substrate and comprising, a soft magnetic film on said substrate, a magnetic separation film on said soft magnetic film, a magnetoresistive film on said magnetic separation film, and an oxide insulation film on said magnetoresistive film; and a peripheral portion around said magnetosensitive portion and comprising, a magnetic layer on said substrate and on side walls of said magnetosensitive portion, and an electrode layer on said magnetic layer and spaced from said magnetoresistive film.

14. The element of claim 13, wherein said electrode layer is on a peripheral portion of a top surface of said oxide insulation film so that said oxide insulation film separates said electrode layer from said magnetoresistive film.

15. The element of claim 13, wherein said oxide insulation film is one of $AlO_x$ and $TaO_x$.

16. The element of claim 13, wherein said magnetosensitive portion is trapezoid shaped and wherein said side walls are sloped side walls of said trapezoid shape.

17. A magnetoresistive element comprising:

a substrate;

a magnetosensitive portion on said substrate and comprising, a magnetic layer on said substrate, a magnetoresistive layer over and spaced from said magnetic layer, and an insulation layer on said magnetoresistive layer; and a peripheral portion around said magnetosensitive portion and comprising, a magnetic layer on said substrate and on side walls of said magnetosensitive portion, and an electrode layer on said magnetic layer and on a peripheral portion of a top surface of said insulation film so that said insulation film separates said electrode layer from said magnetoresistive film.

* * * * *